(12) United States Patent
Kook et al.

(10) Patent No.: US 8,882,953 B2
(45) Date of Patent: Nov. 11, 2014

(54) METHOD FOR FABRICATING CLICHÉ, AND METHOD FOR FORMING THIN FILM PATTERN BY USING THE SAME

(75) Inventors: Yun-Ho Kook, Seoul (KR); Chul-Ho Kim, Paju-si (KR); Sang-Chul Jung, Gumi-si (KR); Jeong-Hoon Lee, Gumi-si (KR); Nam-Kook Kim, Suwon-si (KR); Jun-Young Yang, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 378 days.

(21) Appl. No.: 12/911,495

(22) Filed: Oct. 25, 2010

(65) Prior Publication Data

US 2011/0132527 A1 Jun. 9, 2011

(30) Foreign Application Priority Data

Dec. 7, 2009 (KR) .................. 10-2009-0120473

(51) Int. Cl.
G02F 1/1335 (2006.01)
H01L 51/00 (2006.01)
B41M 3/00 (2006.01)

(52) U.S. Cl.
CPC ........... *H01L 51/0004* (2013.01); *B41M 3/003* (2013.01); *G02F 1/133512* (2013.01); *G02F 1/133516* (2013.01)
USPC ................................ 156/247; 216/43; 216/47

(58) Field of Classification Search
None
See application file for complete search history.

(56) References Cited

U.S. PATENT DOCUMENTS

| 4,155,801 | A | 5/1979 | Provancher |
| 4,983,246 | A * | 1/1991 | Bunting .................. 156/240 |
| 5,227,009 | A | 7/1993 | Sunakawa et al. |
| 6,660,649 | B2 * | 12/2003 | Dao et al. .................. 438/717 |
| 7,100,269 | B2 * | 9/2006 | Sasaki et al. ............... 29/603.2 |
| 7,150,955 | B2 * | 12/2006 | Sato et al. .................. 430/156 |
| 7,338,736 | B2 * | 3/2008 | Kang et al. .................. 430/5 |
| 7,387,740 | B2 * | 6/2008 | Lai .................. 216/17 |
| 2004/0119935 | A1 | 6/2004 | Baek et al. |
| 2006/0091106 | A1 | 5/2006 | Kim |
| 2007/0018199 | A1 * | 1/2007 | Sheppard et al. ............. 257/200 |
| 2009/0283000 | A1 | 11/2009 | Nomoto |
| 2011/0159689 | A1 | 6/2011 | Kim |

FOREIGN PATENT DOCUMENTS

| CN | 1508598 | 6/2004 |
| DE | 10 2005 052 509 A1 | 5/2006 |
| JP | 2006-167937 A | 6/2006 |
| JP | 2007-261144 A | 10/2007 |

(Continued)

*Primary Examiner* — Barbara J Musser
(74) *Attorney, Agent, or Firm* — McKenna Long & Aldridge LLP

(57) ABSTRACT

Disclosed is a method for fabricating a cliché that can prevent formation of a defective thin film pattern, and a method for forming a thin film pattern using the same. The method for fabricating a cliché includes providing a base substrate having first and second regions, forming a first depressed pattern having a first depth and a first width at a first region, and a second depressed pattern having a second width greater than the first width and a depth the same with the first depth at a second region, forming a protective film for exposing the second region and covering the first region, the protective film having adhesivity, forming the second depressed pattern to have a second depth deeper than the first depth of the first depressed pattern at the first region by using the protective film having the adhesivity, and removing the protective film.

9 Claims, 17 Drawing Sheets

(56) References Cited

FOREIGN PATENT DOCUMENTS

| | | |
|---|---|---|
| JP | 2008-198746 | 8/2008 |
| KR | 10-2009-0119358 | 11/2009 |
| TW | 200605373 | 2/2006 |
| TW | 200818287 | 4/2008 |

* cited by examiner

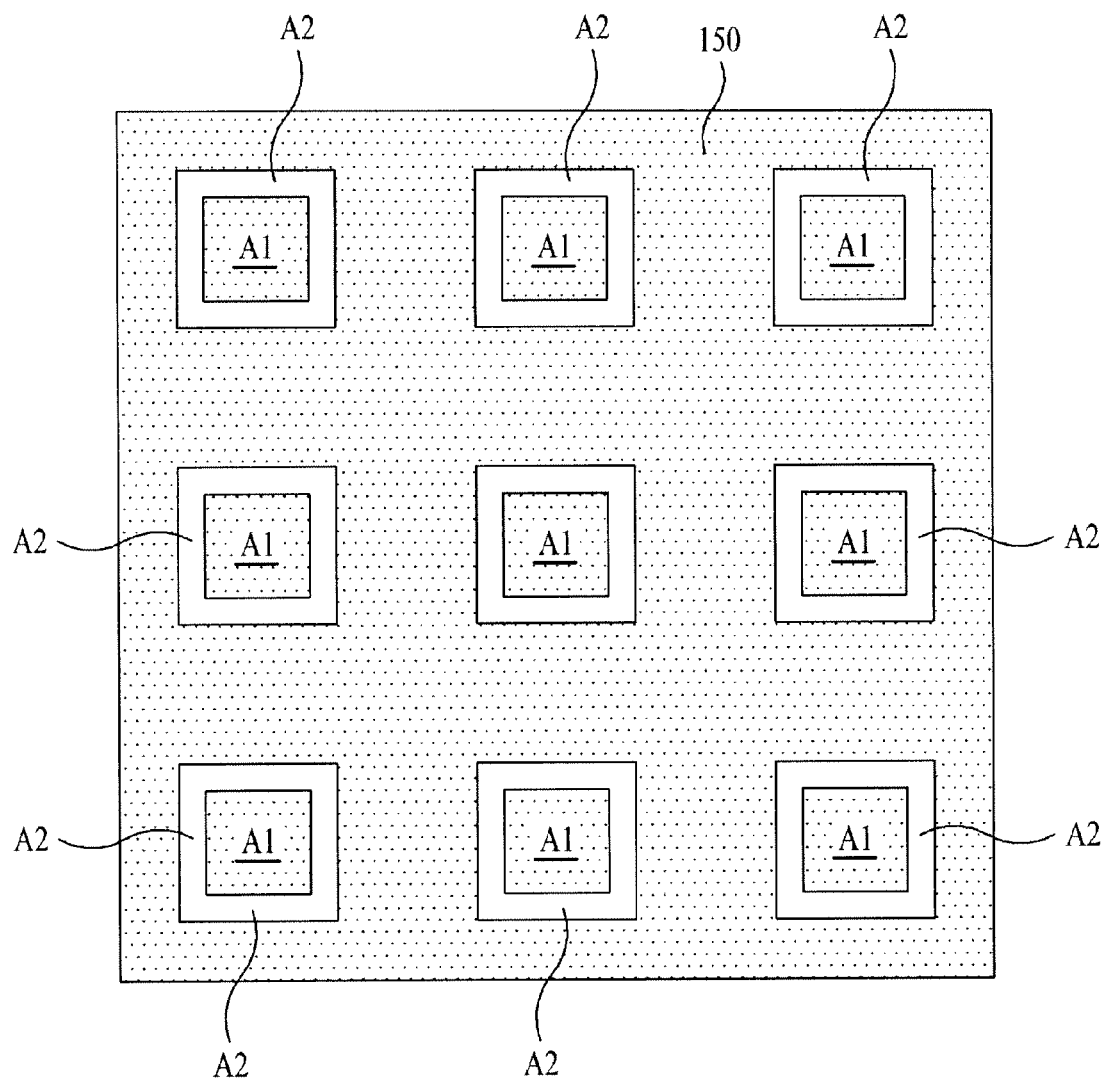

METHOD FOR FABRICATING CLICHÉ, AND METHOD FOR FORMING THIN FILM PATTERN BY USING THE SAME

CROSS REFERENCE TO RELATED APPLICATION

This application claims the benefit of the Korean Patent Application No. 10-2009-0120473, filed on Dec. 7, 2009, which is hereby incorporated by reference as if fully set forth herein.

BACKGROUND OF THE DISCLOSURE

1. Field of the Disclosure

The present invention relates to a method for fabricating a cliché which can prevent formation of a defective thin film pattern, and a method for forming a thin film pattern by using the same.

2. Discussion of the Related Art

Recently, various kinds of flat display devices have been developed, which can reduce weight and volume that are disadvantages of a cathode ray tube. As the flat display device, there is a liquid crystal display device, a field emission display device, a plasma display panel, an electroluminescence EL display device, and so on.

The flat display device is provided with a plurality of thin films formed by mask process including a deposition step, an exposure step, a development step, and etching step, and so on. However, since the mask process as a complicate fabrication process, the mask process increases a production cost. Consequently, researches for forming the thin film by using a printing process utilizing a printing roller are under progress.

The printing process is a process in which a printing liquid is coated on a blanket on the printing roller, a pattern of the printing liquid is formed on the printing roller by using a cliché having a depressed pattern and a relieved pattern, and the pattern of the printing liquid is transcribed to a substrate, thereby forming a desired thin film.

Referring to FIG. 1A, a first depressed pattern 14 matched to a first thin film layer and a second depressed pattern 16 matched to a second thin film layer are formed on the cliche 10 for forming first and second thin film layers of the same material having line widths different from each other.

Referring to FIG. 1B, if the printing roller 20 rolls on the cliche 10, the printing roller 20 is brought into contact A with a bottom surface of the second depressed pattern 16 having the line width greater than the first depressed pattern 14 to transcribe the printing liquid 22 from the printing roller 20 to the bottom surface of the second depressed pattern 16, resulting to lose the printing liquid 22.

Referring to FIG. 1C, if the printing liquid 22 lost thus is transcribed to a substrate 1, the first thin film layer 24, and a pin hole form of a region A in the second thin film layer 26, at which no printing liquid is printed are formed as shown in FIG. 1D. Particularly, if the second thin film layer 26 is used as a black matrix layer or a color filter which is to produce a color, a defective pattern takes place, in which a color is missing showing no color at the region A in the second thin film layer 26.

SUMMARY OF THE DISCLOSURE

Accordingly, the present invention is directed to a method for fabricating a cliché, and a method for forming a thin film pattern by using the same.

An object of the present invention is to provide a method for fabricating a cliché which can prevent formation of a defective thin film pattern, and a method for forming a thin film pattern by using the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the method for fabricating a cliché includes the steps of providing a base substrate having first and second regions, forming a first depressed pattern having a first depth and a first width at a first region, and a second depressed pattern having a second width greater than the first width and a depth the same with the first depth at a second region, forming a protective film for exposing the second region and covering the first region, the protective film having adhesivity, forming the second depressed pattern to have a second depth deeper than the first depth of the first depressed pattern at the first region by using the protective film having the adhesivity, and removing the protective film.

The step of forming a protective film for exposing the second region and covering the first region, the protective film having adhesivity includes the steps of adhering the protective film to the base substrate having the first and second regions, and removing the protective film from the second region by cutting, selectively.

The step of forming a protective film for exposing the second region and covering the first region, the protective film having adhesivity includes the step of adhering the protective film having an opened region at a region corresponding to the second region to the base substrate having the first and second regions.

The step of forming the second depressed pattern to have a second depth deeper than the first depth of the first depressed pattern at the first region includes the step of selectively etching the second region by using the protective film having adhesivity.

The protective film includes adhesive paste, and an acid resistant film formed on the adhesive paste, the acid resistant film being resistant to an etchant used in the etching.

The acid resistant film is formed of PP (Polypropylene), PE (Polyethylene), Teflon, or a material of fluoric resin group.

The first depressed pattern corresponds to a black matrix formed at an active region of the liquid crystal display device and the second depressed pattern corresponds to an outer black matrix formed at an outer region which surrounds the active region of the liquid crystal display device.

In another aspect of the present invention, a method for forming a thin film pattern includes the steps of providing a cliché including a first region having a first depressed pattern with a first depth and a first width, and a second region having a second depressed pattern with a second depth deeper than the first depth and a second width greater than the first width, rolling a printing roller having a printing liquid coated thereon on the cliché to form a first printing pattern having a first line width corresponding to the first depressed pattern and a second printing pattern having a second line width corresponding to the second depressed pattern on the printing roller, and printing the first and second printing patterns formed on the printing roller on the substrate, wherein the step of providing a cliché includes the steps of providing a base substrate having first and second regions, forming a first depressed pattern having a first depth and a first width at a first region, and a second depressed pattern having a second width greater than the first width and a depth the same with the first depth at a second region, forming a protective film for exposing the second region and covering the first region, the protective film having adhesivity, forming the second depressed pattern to have a second depth deeper than the first depth of the first depressed pattern at the first region by using the protective film having the adhesivity, and removing the protective film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 5 illustrates a plan view of the protective film in FIG. 4E, in detail.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1A:
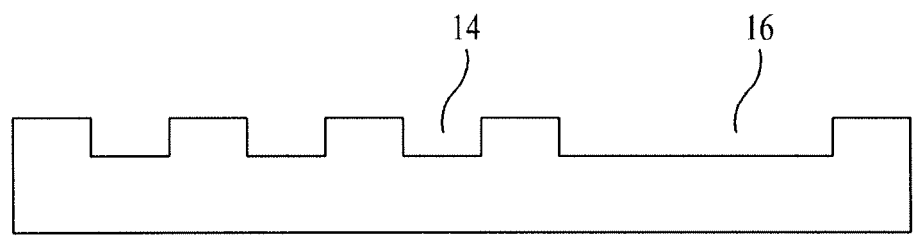
FIGS. 1A to 1D illustrate sections showing the steps of a method for forming a thin film layer by a printing process using a related art cliché.
Figure 1B:
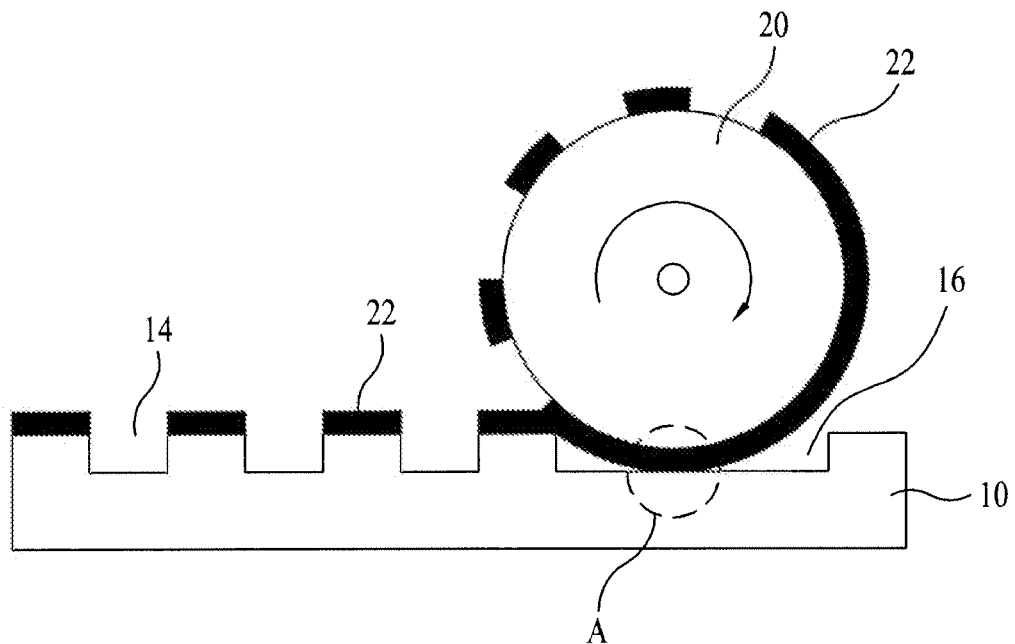
Figure 1C:
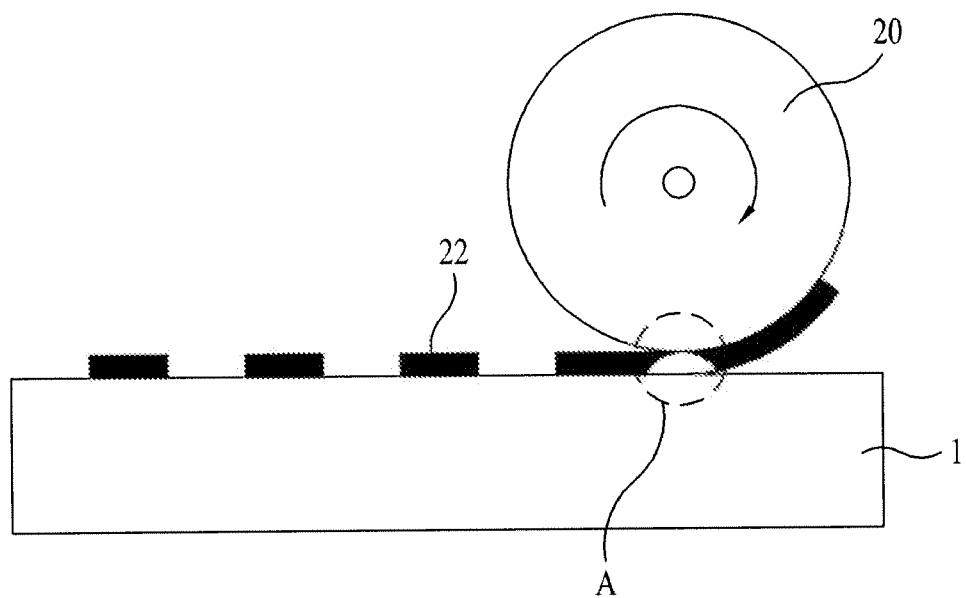
Figure 1D:
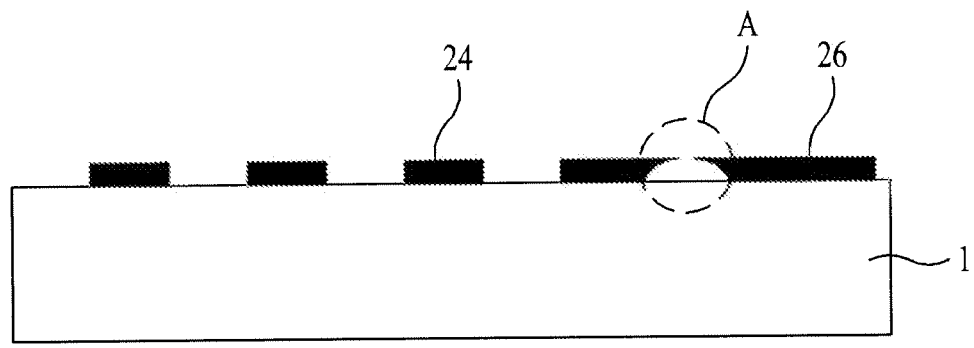
Figure 2:
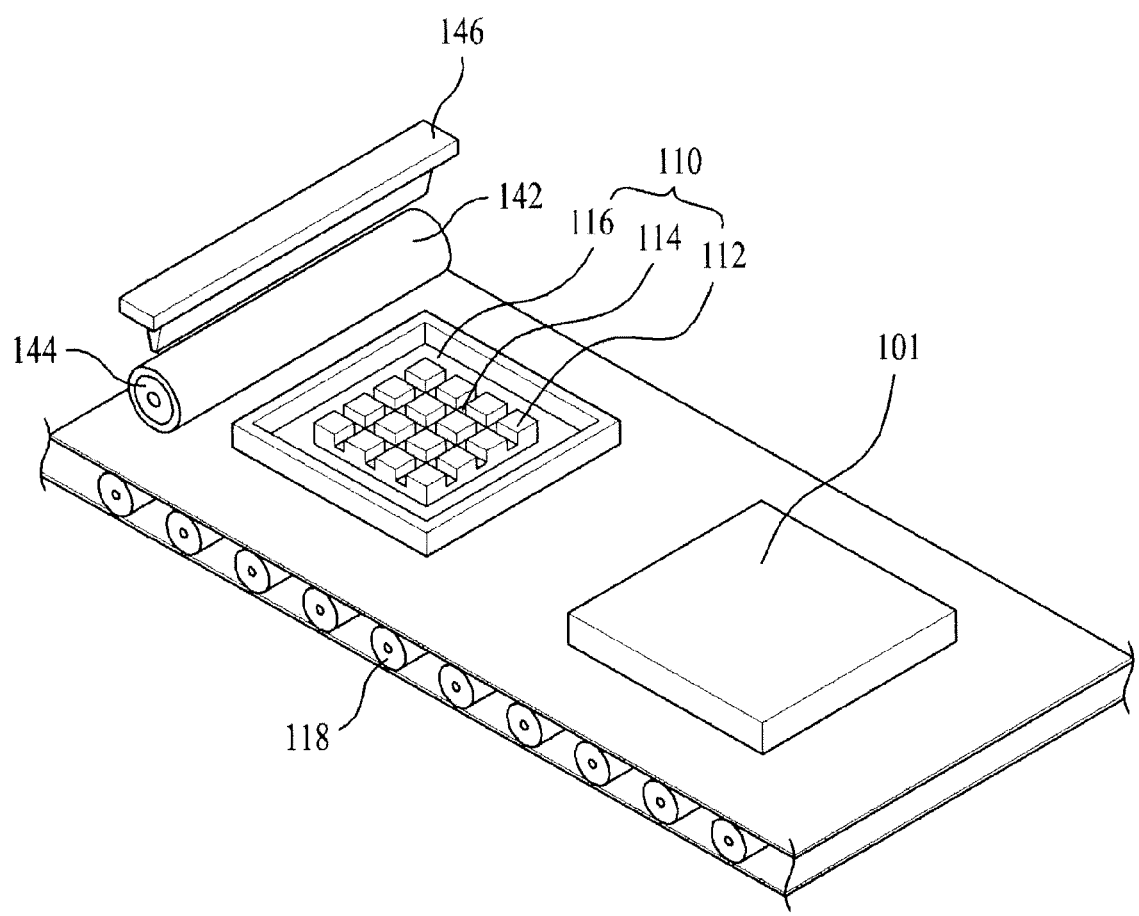
FIG. 2 illustrates a perspective view of an apparatus for forming a thin film pattern in accordance with a preferred embodiment of the present invention.

FIG. 2 illustrates a perspective view of a printing apparatus for forming a thin film pattern in accordance with a preferred embodiment of the present invention.

Referring to FIG. 2, the printing apparatus includes a printing liquid supply unit 146, a printing roller 144, a blanket 142, and a cliché 110.

The printing liquid supply unit 146 holds the printing liquid for supplying the printing liquid to the blanket 142 on the printing roller 144.

The printing roller 144 rolls on the cliché 110 and the substrate 101 which move on a transfer unit 118 such that the printing roller 144 is brought into contact with the cliché 110 and the substrate 101 in succession. Or, alternatively, the printing roller 144 may roll to move on the cliché 110 and the substrate 101 in a state the cliché 110 and the substrate 101 are stationary such that the printing roller 144 is brought into contact with the cliché 110 and the substrate 111 in succession.

The printing roller 144 fills the printing liquid from the printing liquid supply unit 146 to the blanket 142 attached to an outside circumference of the printing roller 144.

The cliché 110 is brought into contact with the printing roller 144 such that the printing liquid filled in the blanket 142 of the printing roller 144 is left only at desired regions.

Figure 3:
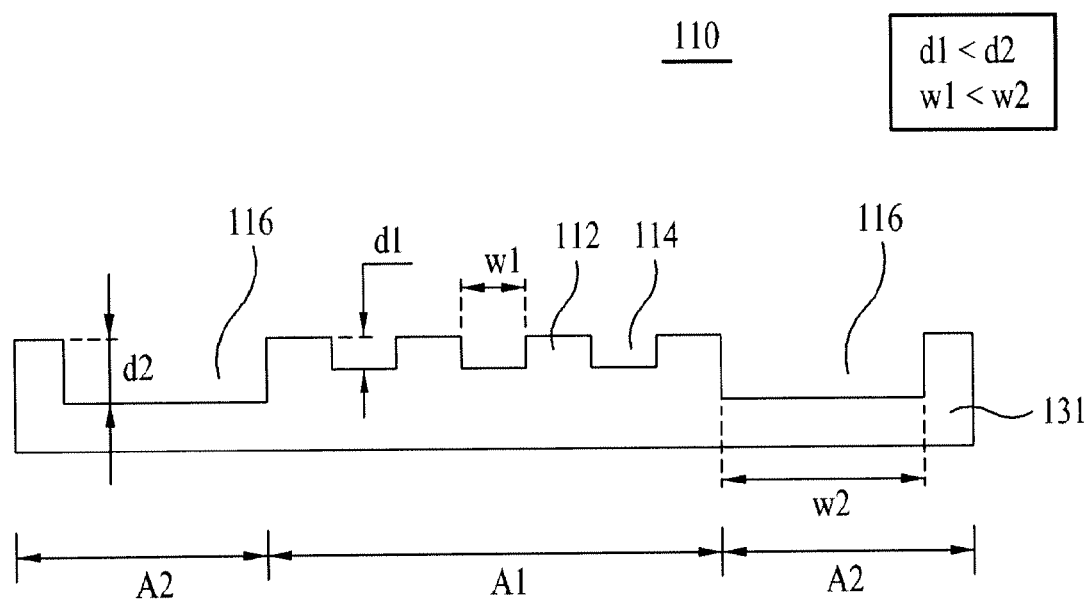
FIG. 3 illustrates a section of the cliché in FIG. 2.

Referring to FIG. 3, in order to form first and second thin film patterns having line widths different from each other on the substrate 101, the cliché 110 includes a first depressed pattern 114 and a relieved pattern 112 formed at a first region A1 and a second depressed pattern 116 formed at a second region A2.

When the printing roller 144 rolls on the cliche 110, the relieved pattern 112 is brought into contact with the printing liquid coated on the printing roller 144. According to this, when the printing roller 144 rolls on the cliche 110, the printing liquid is transcribed from the printing roller 144 to the relieved pattern 112.

However, even if the printing roller 144 rolls on the cliche 110, the first and second depressed patterns 114 and 116 are not brought into contact with the printing liquid on the printing roller 144. According to this, the printing liquid on the printing roller 144 matched to the depressed patterns 114 and 116 are remained on the printing roller 144 to form the first and second thin film patterns on the substrate 101.

Since the first depressed pattern 114 corresponds to the first thin film pattern to be formed on the substrate 101, the first depressed pattern 114 is formed to have a first line width w1 and a first depth d1.

Since the second depressed pattern 116 corresponds to the second thin film pattern having a line width greater than the first thin film pattern to be formed on the substrate 101, the second depressed pattern 116 is formed to have a second line width w2 greater than the first line width w1. In this case, the second depressed pattern 116 of the second line width w2 is formed have a second depth d2 a few μm deeper than the first depth d1 of the first depressed pattern 114 for preventing the printing roller 144 from bringing into contact with the bottom surface of the second depressed pattern 116 when the printing roller 144 is brought into contact with the cliché 110. For an example, the second depressed pattern 116 is formed to have a minimum depth of 65~70 μm and a maximum depth of less than a thickness of the base substrate 131 of the cliché 110.

FIGS. 4A to 4G illustrate sections showing the steps of a method for fabricating a cliché in FIG. 3.

Figure 4A:
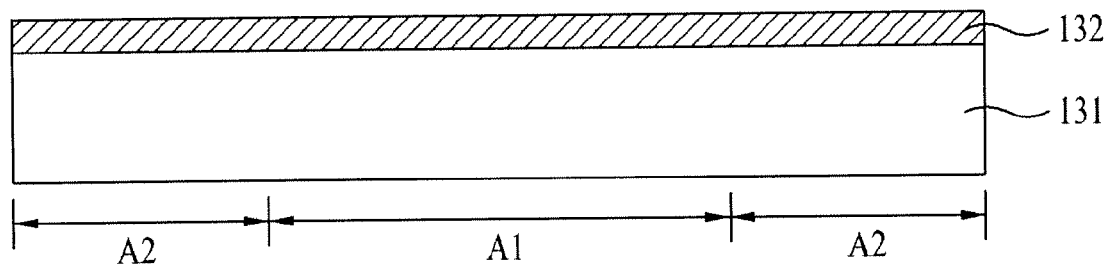
FIGS. 4A to 4G illustrate sections showing the steps of a method for fabricating a cliché in FIG. 3.

Referring to FIG. 4A, a metal layer 132 is formed on a base substrate 131 having first and second regions A1 and A2. The metal layer 132 is single layer or multi-layer of Mo, Al, AlNd, Cr, CrOx having a thickness of about 500~1500 Å. For an example, if the metal layer 132 has multiple layers formed on the lower substrate of the liquid crystal panel, the metal layer 132 has a stack of Mo/AlNd, or if the metal layer 132 has multiple layers formed on the upper substrate of the liquid crystal panel, the metal layer 132 has a stack of Cr/CrOx.

Figure 4B:
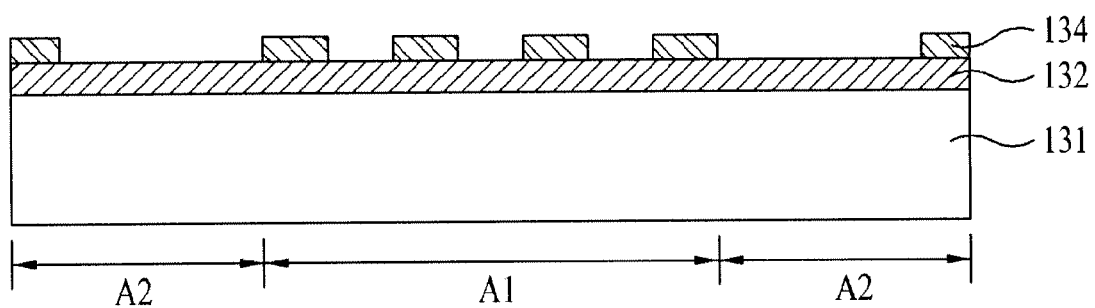

Photoresist is coated on the metal layer 132 and subjected to photolithography having exposure and development to pattern the photoresist, to form a photoresist pattern 134 as shown in FIG. 4B.

Figure 4C:
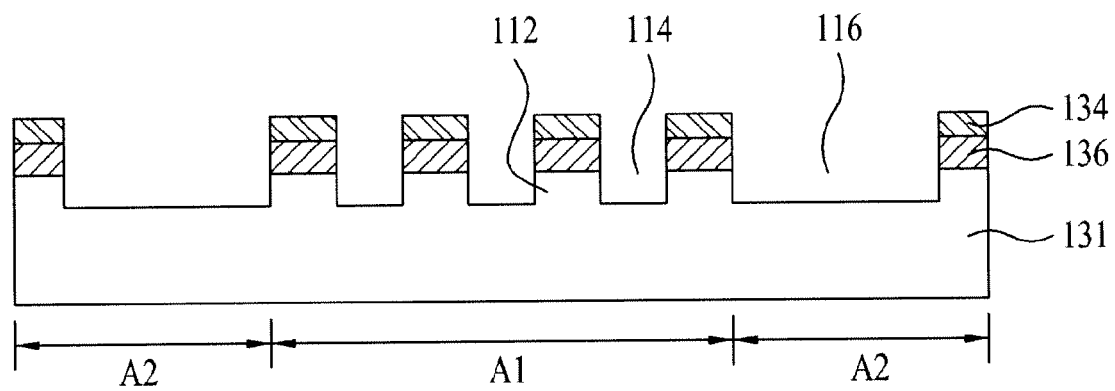

The metal layer 132 is etched by using the photoresist pattern 134 to pattern the metal layer 132 to form a metal pattern 136 as shown in FIG. 4C.

Figure 4D:
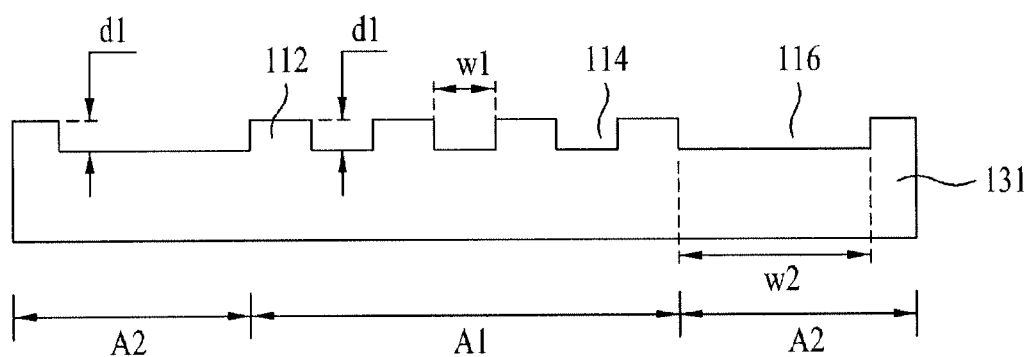

An etching is performed by using the metal pattern 136 and the photoresist pattern 134 as a mask to etch the base substrate 131 down to a few μm depths for the first time. In this instance the base substrate 131 is wet etched with an HF group etchant having 2~25 wt % concentration. According to this, as shown in FIG. 4D, a cliché is formed, having a first depressed pattern 114 with a first depth d1 and a first width w1, and a second depressed pattern 116 with a first depth d1 and a second width w2. The photoresist pattern 134 remained on the cliché 110 is removed by stripping, and the metal pattern 136 is removed by etching.

Figure 4E:
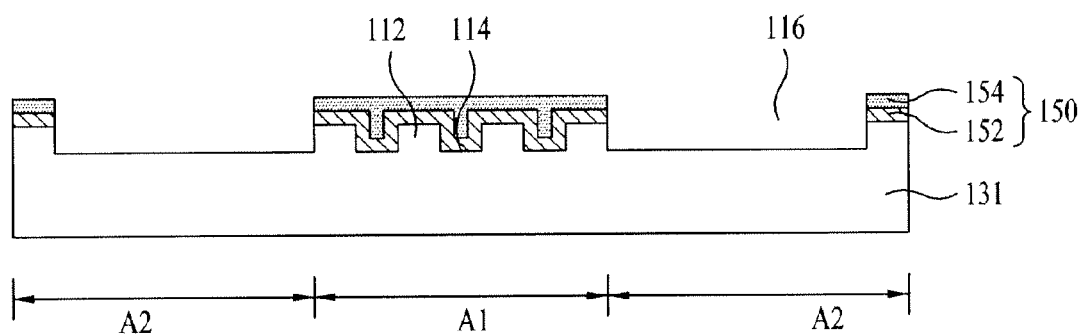

Then, referring to FIGS. 4E and 5, of the first and second regions A1 and A2 of the base substrate 131, a protective film 150 is formed at the first region A1, selectively, detailed description of which will be described with reference to FIGS. 6A to 6C.

Figure 6A:
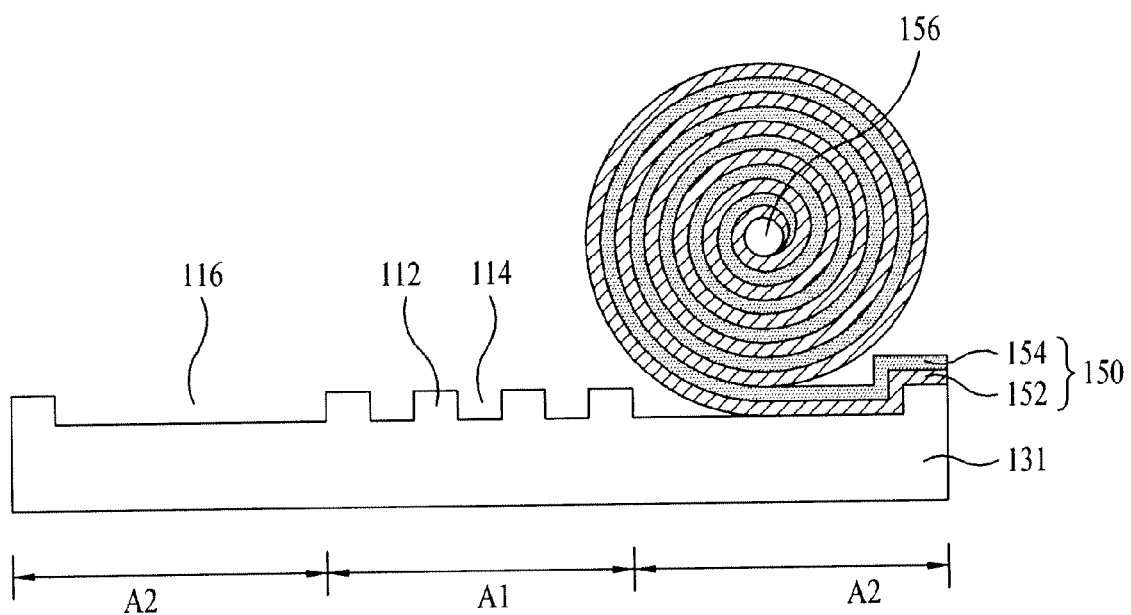
FIGS. 6A to 6C illustrate sections showing the steps of a patterning process by using the protective film in FIG. 4E.
Figure 6B:
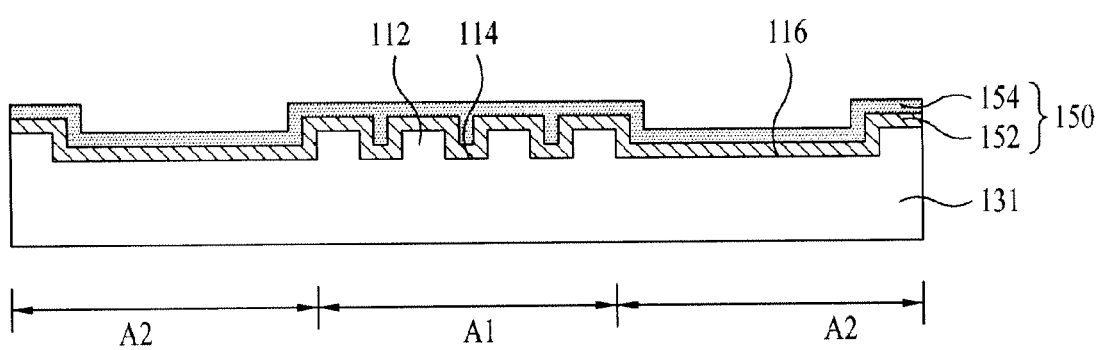
Figure 7:
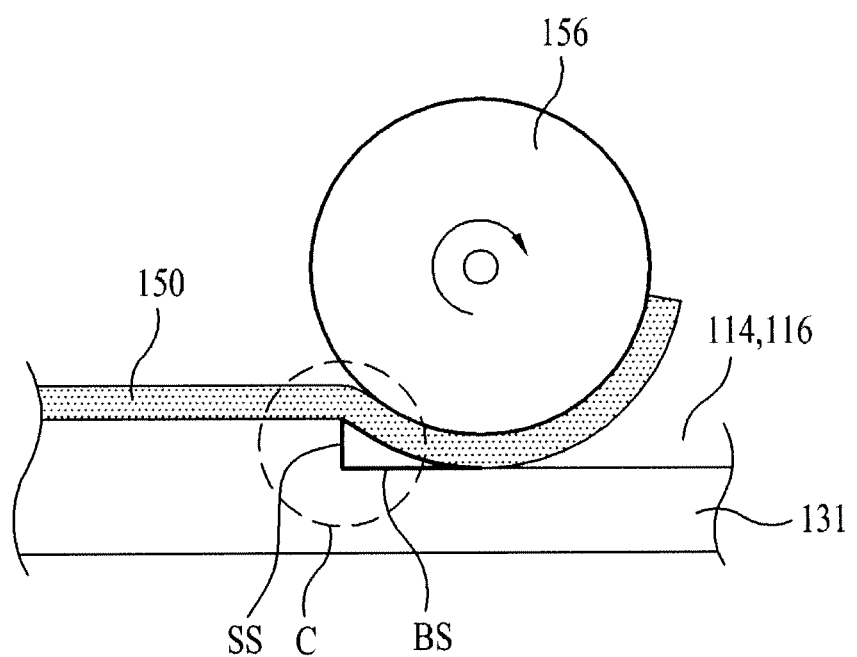
FIG. 7 illustrates a section for explaining thickness of an adhesive paste of the protective film shown in FIG. 6A or 6B.

By using a laminated roller 156 as shown in FIG. 6A, the protective film 150 having adhesivity is attached to an entire surface of the cliché 110 as shown in FIG. 6B. The protective film 150 is constructed of adhesive paste 152 and an acid resistant film 154 formed on the adhesive paste 152. In this instance, the acid resistant film 154 has a thickness of 20~40 μm of PP (Polypropylene), PE (Polyethylene), Teflon, or a material of fluoric resin group, and the adhesive paste 152 has a thickness of 30~50 m. As shown in FIG. 7, if the adhesive paste 152 has a thickness less than 30 μm, the protective film 150 positioned between a side surface SS and a bottom surface BS of the first depressed pattern 114 or the second depressed pattern 116 can not transmit a pressure from the laminated roller 156 to the side surface SS and the bottom surface BS properly, and is not adhered thereto (C region) properly due to relatively weak adhesive force compared to the thickness of the adhesive paste 152. In this case, an etchant infiltrates through a vacant space between the protective film 150 and the side surface SS and the bottom surface BS of the first depressed pattern 114 or the second depressed pattern 116 in a second time etching to be performed later. If the adhesive paste 152 has a thickness exceeding 50 μm, such that the adhesive force of the adhesive paste 152 is strong relatively, the adhesive paste 152 is not separated from the base substrate 131 properly, later.

Accordingly, in order to prevent the etchant from infiltrating between the side surface SS and a bottom surface BS of the first depressed pattern 114 or the second depressed pattern 116, and separate the adhesive paste 152 from the base substrate 131 properly, the adhesive paste 152 is formed to have a thickness of 30~50 μm.

Figure 6C:
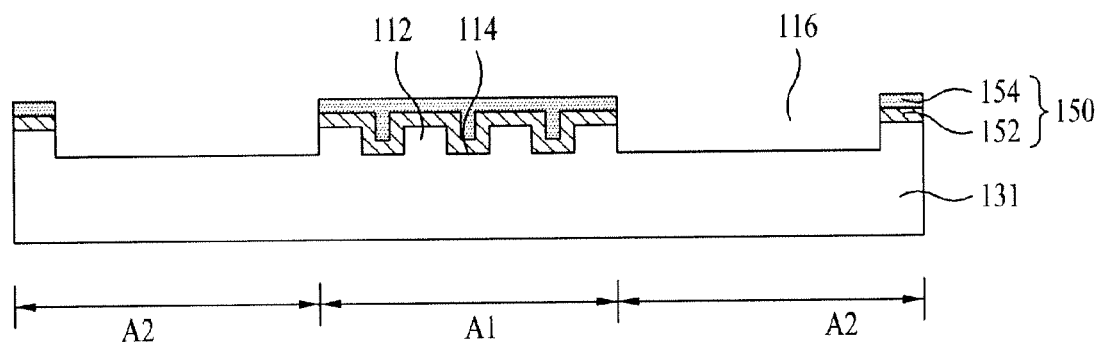
Figure 8:
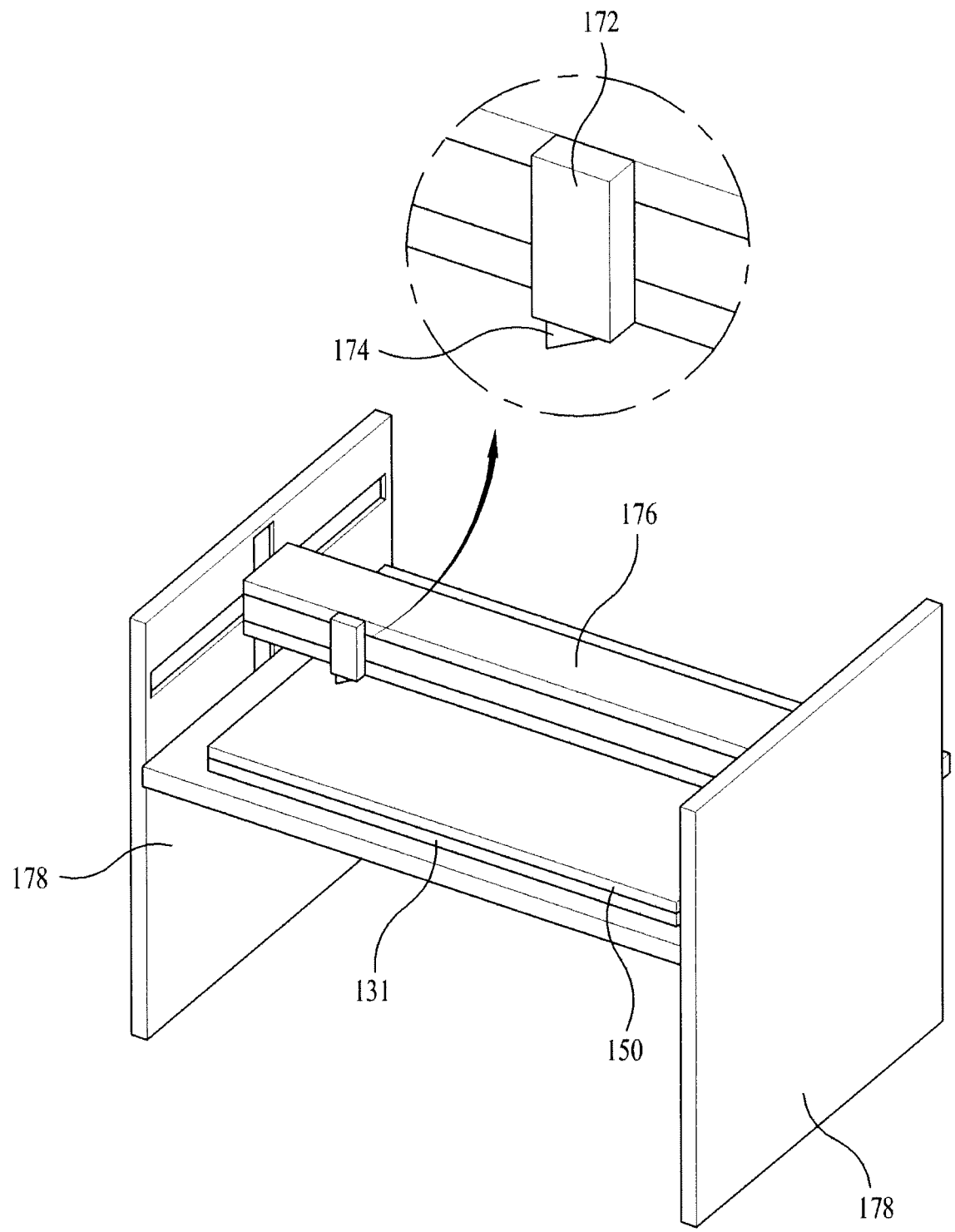
FIG. 8 illustrates a perspective view of a cutting machine for cutting the protective film in FIG. 6C.

Then, referring to FIG. 8, the protective film 150 is removed from the second region A2 selectively as shown in FIG. 6C by a cutting machine as shown in FIG. 8. The cutting machine in FIG. 8 includes a supporting frame 178, a guide rail 176, a cutter 174, and a gantry 172. The supporting frame 178 supports the base substrate 131 having the protective film 150 adhered thereto and the guide rail 176 at opposite ends thereof to be movable in up/down directions. The gantry 172 having the cutter 174 attached thereto couples to the guide rail 176, and the gantry 172 moves along the guide rail 176. The cutter 174 moves along the guide rail 176 and cuts the protective film 150 such that the second region A2 is exposed.

In the meantime, referring to FIG. 6B, the exposure of the second region A2 is described taking the adhering of the protective film 150 to an entire surface of the base substrate 131 and cutting the protective film 150 with the cutter 174 as an example, the exposure of the second region A2 is described taking adhering the protective film 150 having opened regions matched to the second region A2 to the base substrate 131 as another example to omit the cutting step for simplifying the fabrication process.

Figure 4F:
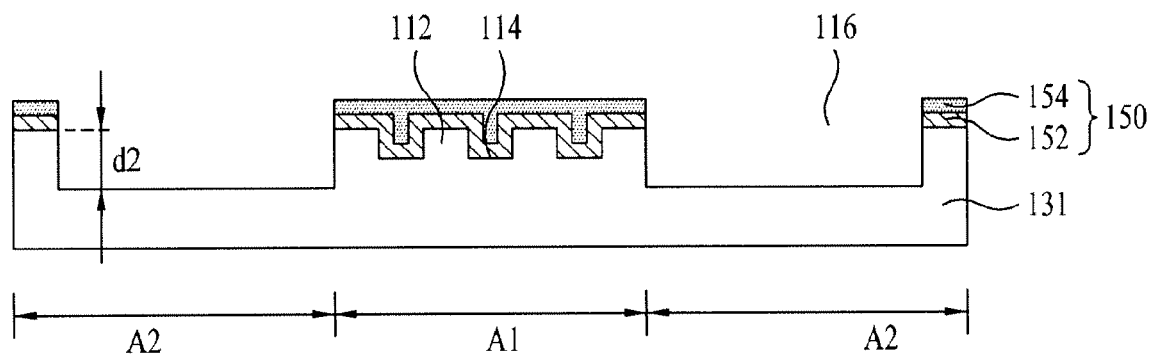
Figure 4G:
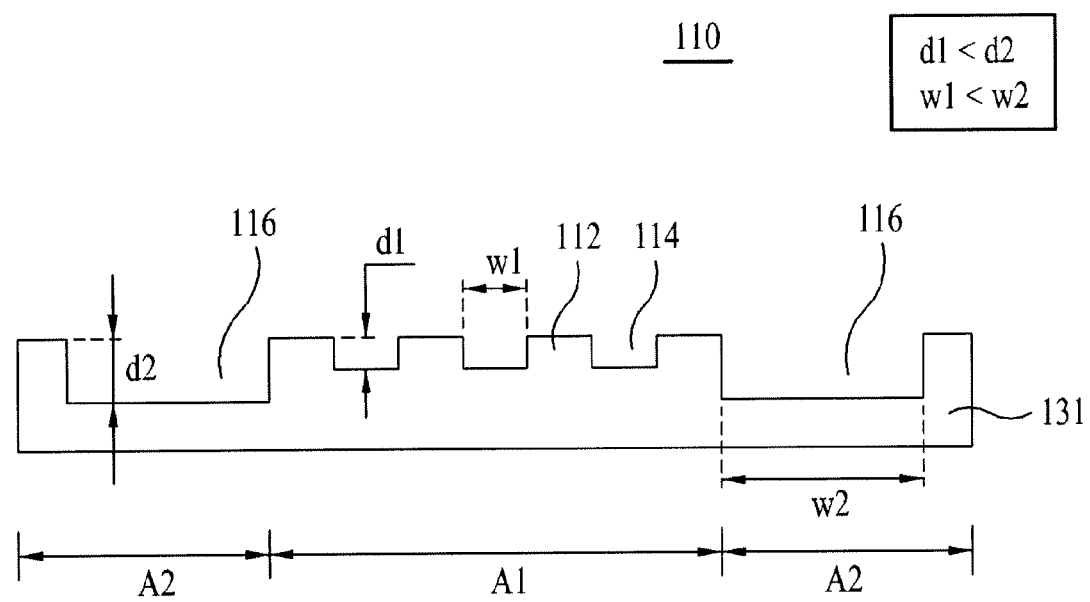

Referring to FIG. 4F, the second depressed pattern 116 of the second region A2 exposed by cutting of the protective film 150 thus is etched by using the protective film 150 as a mask for the second time. In this instance, the base substrate 131 is wet etched with an HF group etchant having 2~25 wt % concentration. According to this, the second depressed pattern 116 becomes to have the second depth d2 deeper than the first depth d1 of the first depressed pattern 114. Then, the protective film 150 remained on the cliché 110 is removed manually or automatically by using a machine. Eventually, fabrication of the cliché 110 is finished, the cliché 110 having the first depressed pattern 114 formed at the first region A1 of the base substrate 131, and the second depressed pattern 116 formed at the second region A2 of the base substrate 131.

Figure 9A:
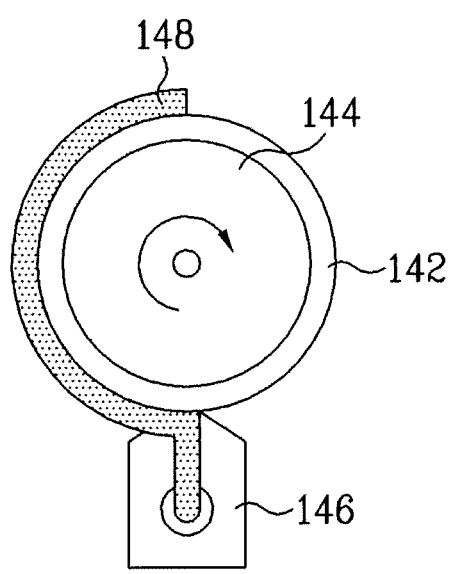
FIGS. 9A to 9D illustrate sections showing the steps of a method for forming a thin film pattern by using a cliché in FIG. 2.
Figure 9B:
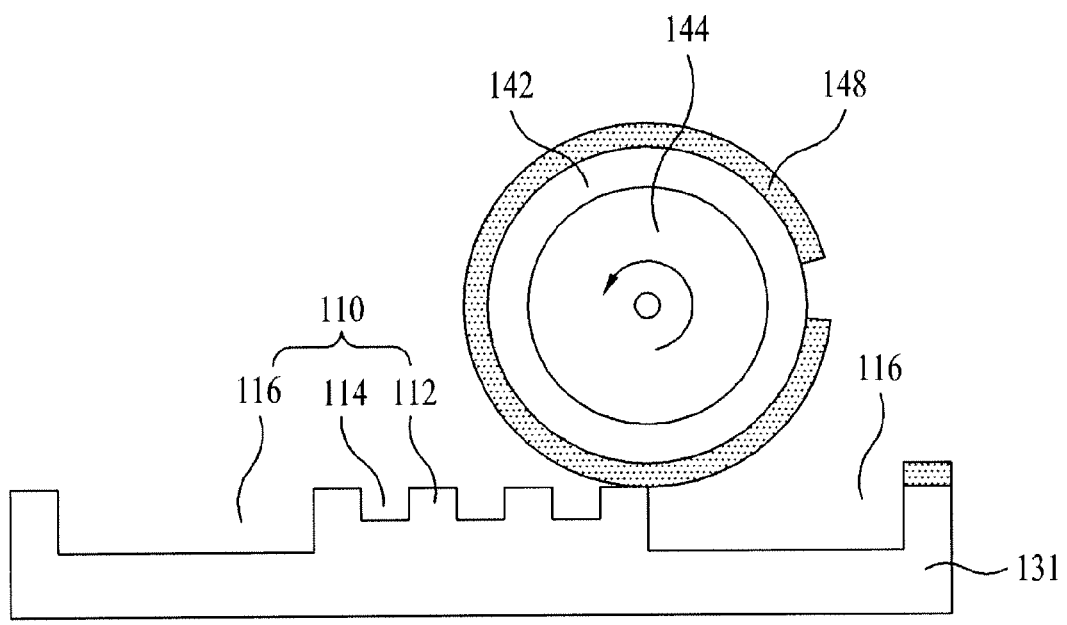
Figure 9C:
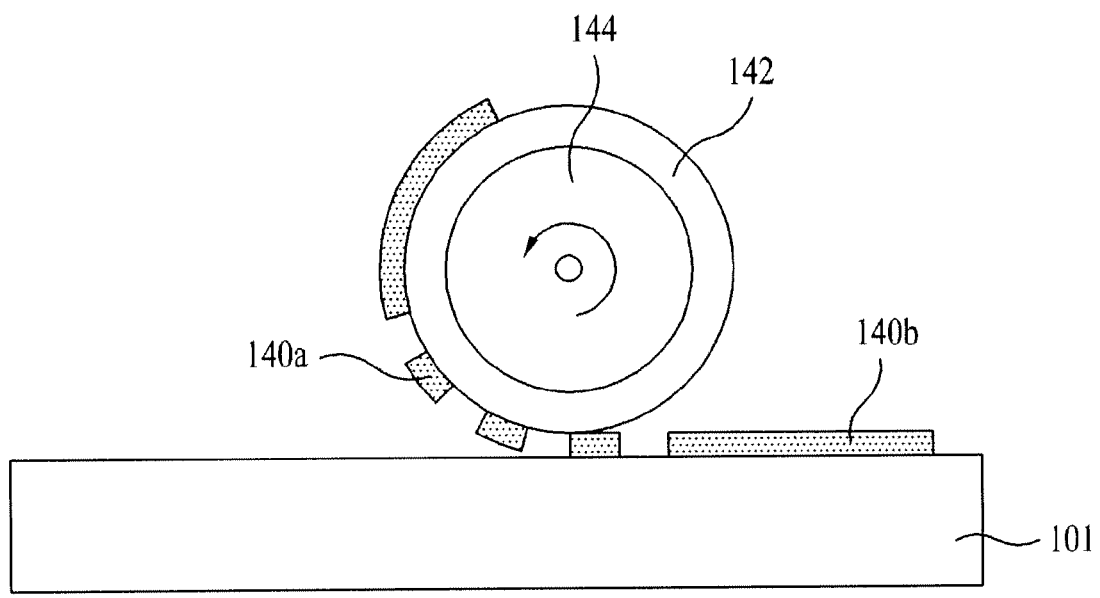
Figure 9D:
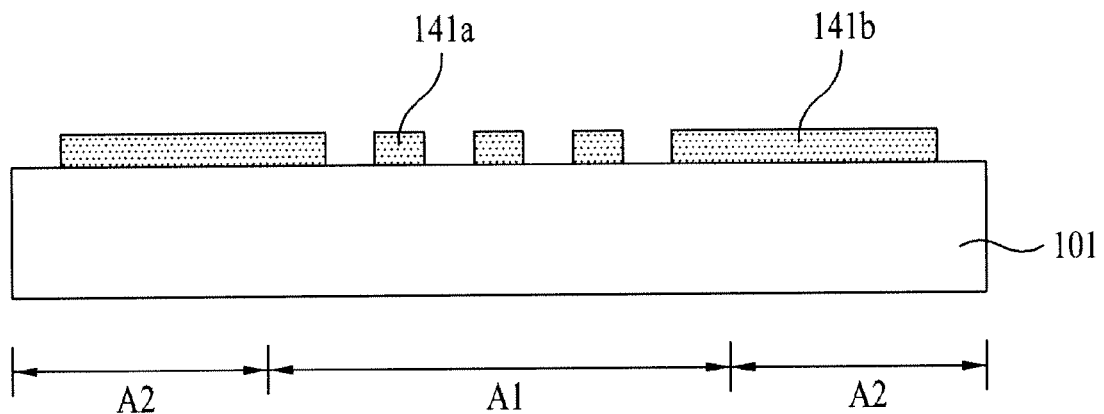

FIGS. 9A to 9C illustrate sections showing the steps of a method for patterning a thin film by using a printing roller having a blanket attached thereto in accordance with a preferred embodiment of the present invention.

Referring to FIG. 9A, a printing roller 144 having a blanket 142 attached thereto is provided. The blanket 142 has printing liquid 148 filled therein through a printing liquid supplying unit 146.

Then, referring to FIG. 9B, the printing roller 144 having the printing liquid 148 coated thereon is rolled on the cliché 110 having first and second depressed patterns 114 and 116. The printing liquid 148 at a region which is brought into contact with the relieved pattern 112 is transcribed to the relieved pattern 112, and the printing liquid 148 which is not brought into contact with the first and second depressed patterns 114 and 116 is remained on a surface of the blanket 142 to form first and second printing patterns 140a and 140b.

Referring to FIG. 9C, the printing roller 144 having the first and second printing patterns 140a and 140b formed thereon is rolled on the substrate 101. According to this, the first and second printing patterns 140a and 140b are transcribed to the substrate 101, dried and cured to form first and second thin film patterns 141a and 141b having line widths different from each other.

Figure 10:
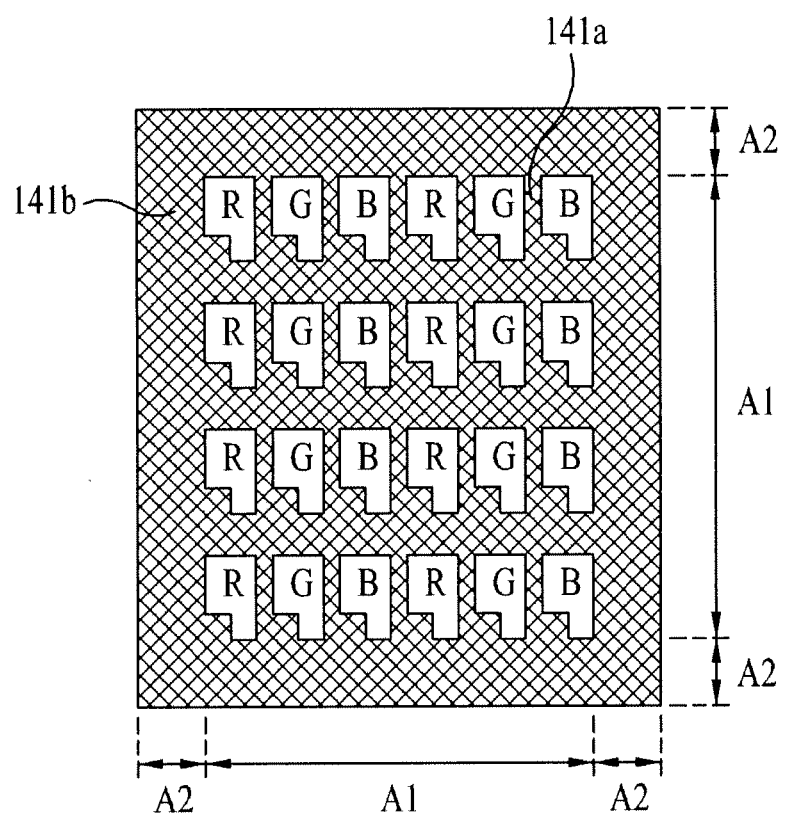
FIG. 10 illustrates a plan view of a black matrix formed by the steps of a method for forming a thin film pattern shown in FIGS. 9A to 9D.

In this instance, referring to FIG. 10, the thin film pattern 141a is used as a black matrix positioned at an active region A1 of the liquid crystal panel, and the second thin film pattern 141b is used as an outer black matrix positioned at an outer region A2 which surrounds the active region A1 of the liquid crystal panel.

Besides, the printing apparatus of the present invention can form thin films or thick films, not only on the liquid crystal panel, but also on a flat display device, such as a plasma display panel, an electroluminescence EL display panel, a field emission display device, and the like.

Figure 11:
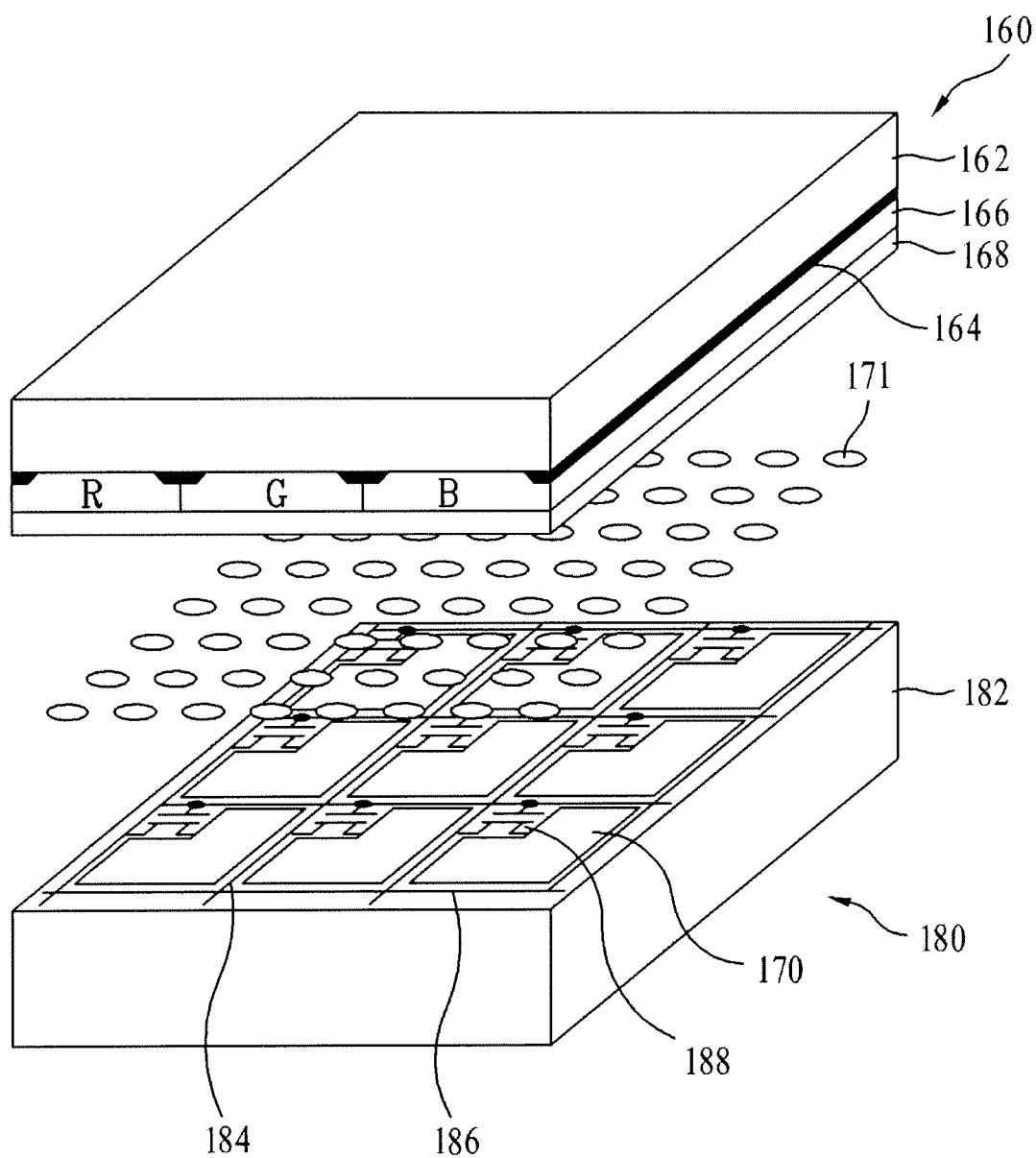
FIG. 11 illustrates a plan view of a liquid crystal panel having a thin film pattern formed by the steps of a method for forming a thin film pattern shown in FIGS. 9A-9D.

In detail, referring to FIG. 11, the liquid crystal panel of the present invention includes a thin film transistor substrate 180 and a color filter substrate 160 bonded opposite to each other with a liquid crystal layer 171 disposed therebetween.

The color filter substrate 160 includes a black matrix 164, a color filter 166, a common electrode 168, column spacers (not shown) formed on an upper substrate 162 in succession.

The thin film transistor substrate 180 includes gate lines 186 and data lines 184 formed to cross each other on a lower substrate 182, a thin film transistor 188 formed adjacent to every crossing portion thereof, and a pixel electrode 170 formed at every pixel region formed by the crossed structure.

The printing process of the present invention can form the thin film pattern of an organic material, such as an organic thin film layer including the color filter 166, the black matrix 164 and the column spacers of the liquid crystal panel, and the electroluminescence layer of an organic electroluminescence display device, and a printing pattern used as a mask for patterning a thin film of inorganic material, such as the thin film transistor 188, the gate line 186, the data line 184, the pixel electrode 170 and the like of the liquid crystal panel.

As has been described, the method for fabricating a cliché, and the method for forming a thin film pattern by using the same of the present invention have the following advantages.

By forming a depressed pattern corresponding to a thin film pattern having a great line width deeper than a depressed pattern corresponding to a thin film pattern having a small line width in the cliché, the contact of the printing roller to a bottom surface of the cliché can be prevented. Accordingly, the method for fabricating a cliché, and the method for forming a thin film pattern by using the same can prevent a defective pattern, particularly, color missing, from taking place.

By the first time etching of the base substrate by using the photoresist pattern and the metal pattern formed by photolithography and etching and the second time etching of the base substrate by using the protective film as a mask permits to form the cliché having at least two different line widths and at least two different depths. Since a cliché having various pattern line widths and etch depths can be formed by one time of photolithography and two times of etching, a cost for the mask step can be saved and a fabrication process can be simplified.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a cliché comprising the steps of:
    providing a base substrate having first and second regions;
    forming a plurality of first depressed patterns having a first depth and a first width, and relieved patterns at a first region, and a plurality of second depressed patterns having a second width greater than the first width and a depth the same with the first depth at a second region by etching the base substrate itself for a first time using a metal pattern and a photoresist pattern as a mask;
    removing the metal pattern and the photoresist pattern;
    forming a protective film for exposing the second region and covering the first region, the protective film having adhesivity;
    forming the second depressed patterns to have a second depth deeper than the first depth of the first depressed patterns at the first region by selectively etching the second region of the base substrate itself for a second time using the protective film having the adhesivity as a mask, wherein the relieved patterns are located between each of the first depressed patterns and an adjacent second depressed pattern; and
    removing the protective film.

2. The method as claimed in claim 1, wherein the step of forming a protective film for exposing the second region and covering the first region includes the steps of:
    adhering the protective film to the base substrate having the first and second regions, and
    removing the protective film from the second region by cutting, selectively.

3. The method as claimed in claim 1, wherein the step of forming a protective film for exposing the second region and covering the first region includes the step of:
    adhering the protective film having an opened region at a region corresponding to the second region to the base substrate having the first and second regions.

4. The method as claimed in claim 1, wherein the protective film includes;
    adhesive paste; and
    an acid resistant film formed on the adhesive paste, the acid resistant film being resistant to an etchant used in the etching.

5. The method as claimed in claim 4, wherein the acid resistant film is formed of PP (Polypropylene), PE (Polyethylene), Polytetrafluoroethylene, or a material of fluoric resin group.

6. The method as claimed in claim 1, wherein the first depressed pattern corresponds to a black matrix formed at an active region of a liquid crystal display device and the second depressed pattern corresponds to an outer black matrix formed at an outer region which surrounds the active region of the liquid crystal display device.

7. A method for forming a thin film pattern comprising the steps of:
    providing a cliché including a first region having a plurality of first depressed patterns with a first depth and a first width, and a plurality of relieved patterns, and a second region having a plurality of second depressed patterns with a second depth deeper than the first depth and a second width greater than the first width, wherein the relieved patterns are located between each of the first depressed patterns and an adjacent second depressed pattern;
    rolling a printing roller having a printing liquid coated thereon on the cliché to form a first printing pattern having a first line width corresponding to the first depressed patterns and a second printing pattern having a second line width corresponding to the second depressed patterns on the printing roller; and
    printing the first and second printing patterns formed on the printing roller on a substrate,
    wherein the step of providing a cliché includes the steps of;
    providing a base substrate having first and second regions;
    forming the first depressed patterns having the first depth and the first width, and the relieved patterns at the first region, and the second depressed patterns having the second width greater than the first width and a depth the same with the first depth at the second region by etching the base substrate itself for a first time using a metal pattern and a photoresist pattern as a mask;
    removing the metal pattern and the photoresist pattern;
    forming a protective film for exposing the second region and covering the first region, the protective film having adhesivity;
    forming the second depressed pattern to have the second depth deeper than the first depth of the first depressed pattern at the first region by selectively etching the second region of the base substrate itself for a second time using the protective film having the adhesivity as a mask; and
    removing the protective film.

8. The method as claimed in claim 7, wherein the first printing pattern corresponds to a black matrix formed at an active region of the liquid crystal display device and the second printing pattern corresponds to an outer black matrix formed at an outer region which surrounds the active region of the liquid crystal display device.

9. The method as claimed in claim 7, wherein the protective film includes:
adhesive paste having adhesivity; and
an acid resistant film having resistance to an etchant, and is formed of PP (Polypropylene), PE (Polyethylene), Polytetrafluoroethylene, or a material of fluoric resin group on the adhesive paste.

* * * * *